United States Patent [19]

Scott

[11] Patent Number: 4,485,355
[45] Date of Patent: Nov. 27, 1984

[54] SWITCHED GEOMETRY OSCILLATOR

[75] Inventor: Bentley N. Scott, Richardson, Tex.

[73] Assignee: Texas Instruments Incorporated, Dallas, Tex.

[21] Appl. No.: 345,265

[22] Filed: Feb. 2, 1982

[51] Int. Cl.[3] .......................... H03B 5/12; H03B 5/18
[52] U.S. Cl. ............................... 331/117 FE; 331/96; 331/100; 331/179; 331/117 R; 331/117 D
[58] Field of Search .................. 455/315; 331/100, 96, 331/179, 117 R, 117 FE, 117 D

[56] References Cited

PUBLICATIONS

Scott et al., "Octave Band Varactor-Tuned GaAs FET Oscillators", *IEEE International Solid-State Circuits Conference*, (Feb. 1981), pp. 138–139.
Scott, B. N., "GaAs Switched Geometry Oscillator for X and Ku Bands", *IEEE International Solid-State Circuits Conference*, (Feb. 11, 1982), pp. 190–191.

*Primary Examiner*—Siegfried H. Grimm
*Assistant Examiner*—D. C. Mis
*Attorney, Agent, or Firm*—Robert Groover, III; James T. Comfort; Melvin Sharp

[57] ABSTRACT

A very simple oscillator circuit, using a FET pair with RF coupled, DC isolated gates, selectively operates at two widely separated microwave frequencies. The two FETs are DC isolated so that one of them can be pinched off (to act as a passive element) while the other remains active. Thus, for example, a two-FET push-push oscillator operating at 20 GHz can switch downband, when one FET is pinched off, to act as a fundamental mode oscillator at 12½ GHz. The circuit is integrable. In alternative embodiments, more than two FETs are used, for switching over a wider frequency range when one or two of them is pinched off.

10 Claims, 12 Drawing Figures

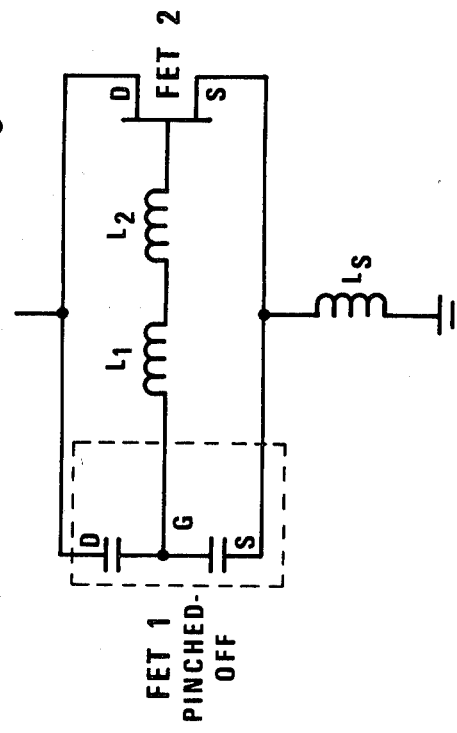
12.5 GHz Fig. 2(B)
FET 1 PINCHED-OFF
COMMON GATE OSCILLATOR
- ONE DEVICE OPERATIONAL (FET 2)
- SECOND DEVICE PINCHED-OFF (FET 1)
- FUNDAMENTAL OUTPUT FREQUENCY
- +10 dBm OUTPUT POWER AT 13.5 GHz
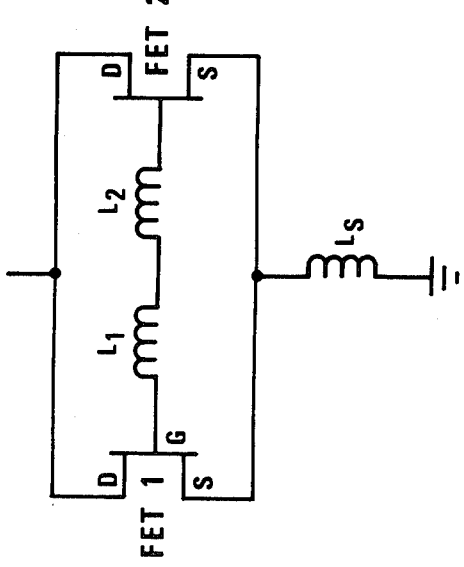
20 GHz Fig. 2(A)
PUSH-PUSH OSCILLATOR
- TWO DEVICES OPERATIONAL
- OUTPUT AT TWICE OF EACH FET's OPERATING FREQUENCY
- FUNDAMENTAL FREQUENCY GREATER THAN 50 dB DOWN FROM 2nd HARMONIC
- +2 dBm OUTPUT AT 20 GHz

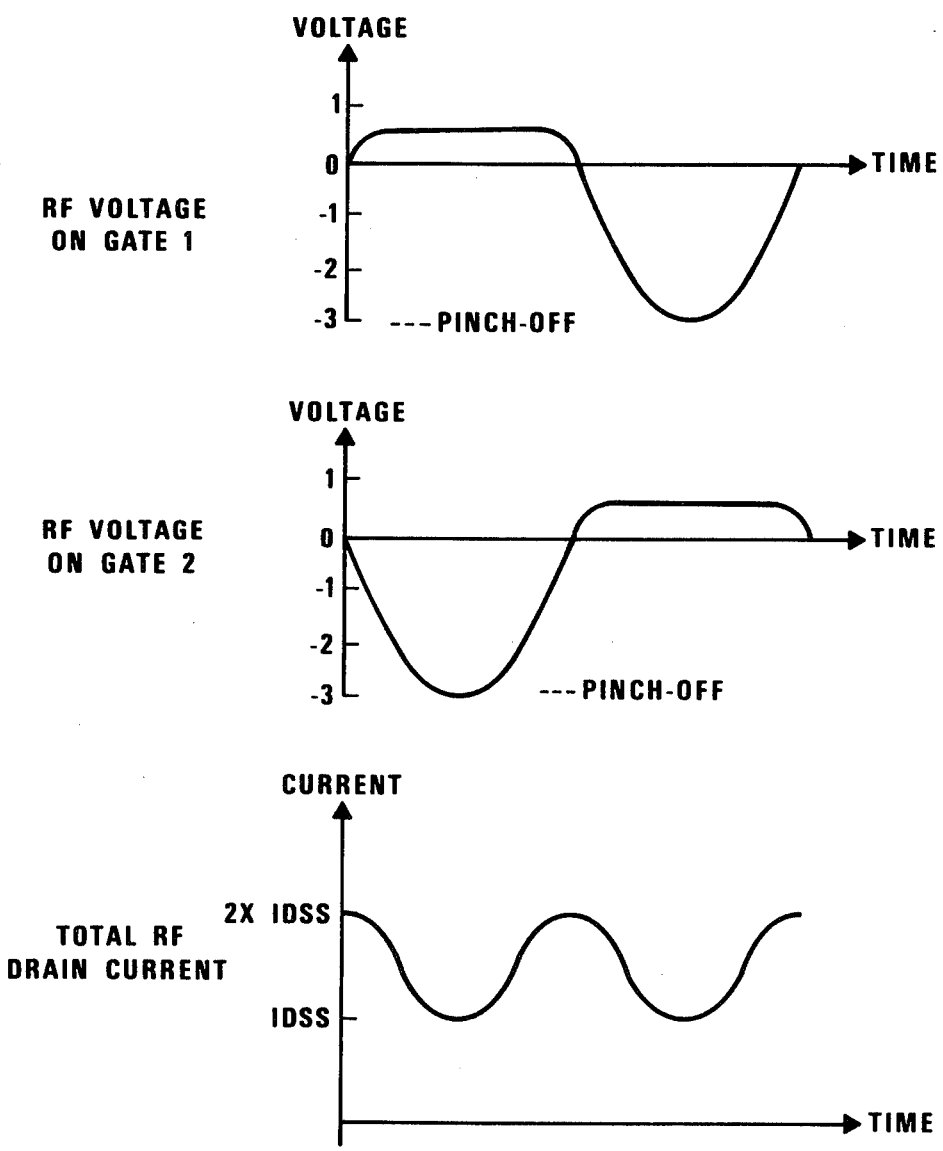

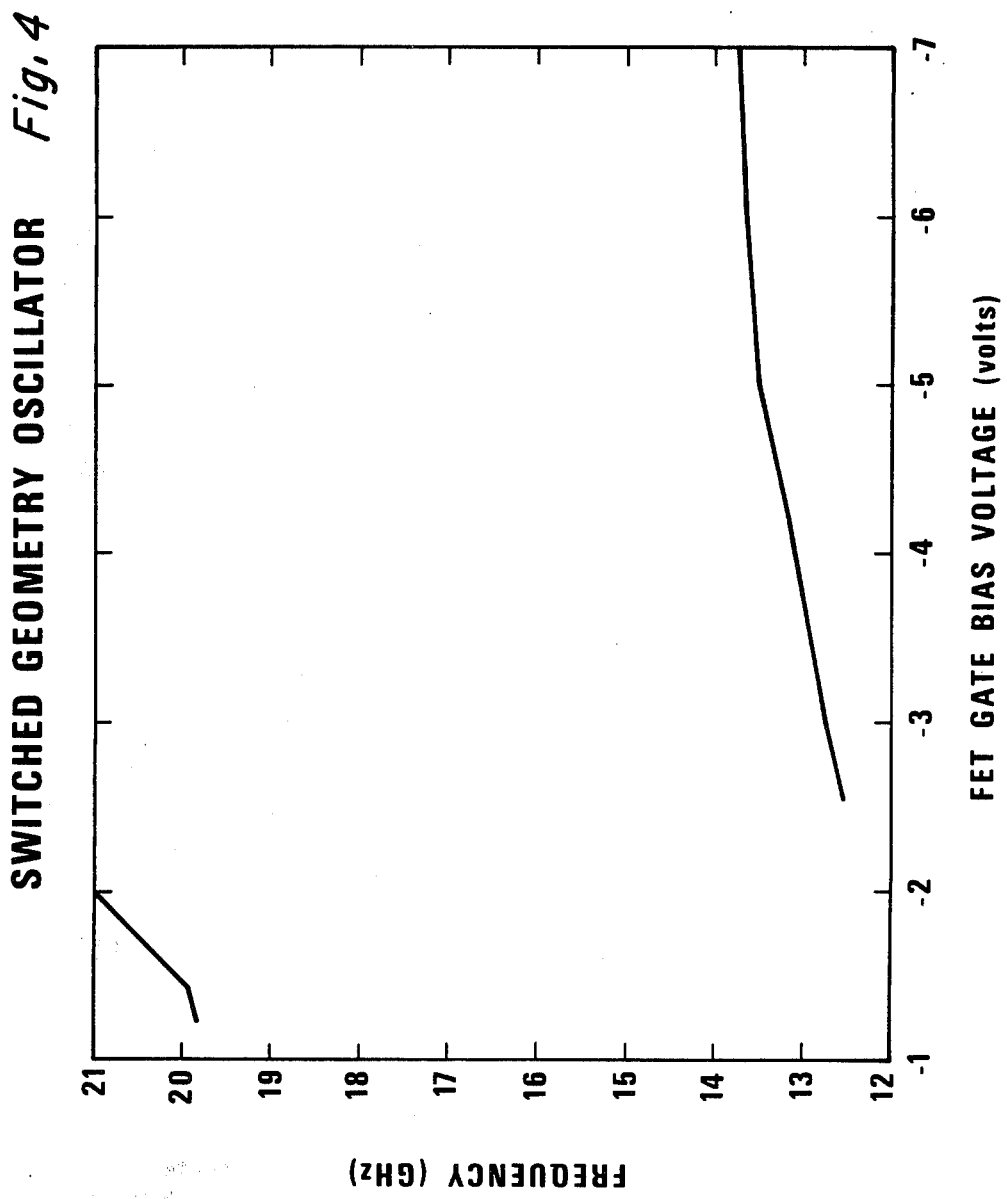
Fig. 4 SWITCHED GEOMETRY OSCILLATOR

- PUSH—PUSH OPERATION
- GATES ARE SEPARATELY TIED TO THE FEEDBACK INDUCTANCES

- FUNDAMENTAL OPERATION
- GATES ARE INTIMATELY TIED TOGETHER
- EACH FET ACTS IN SYNCHRONIZATION WITH THE OTHER FET

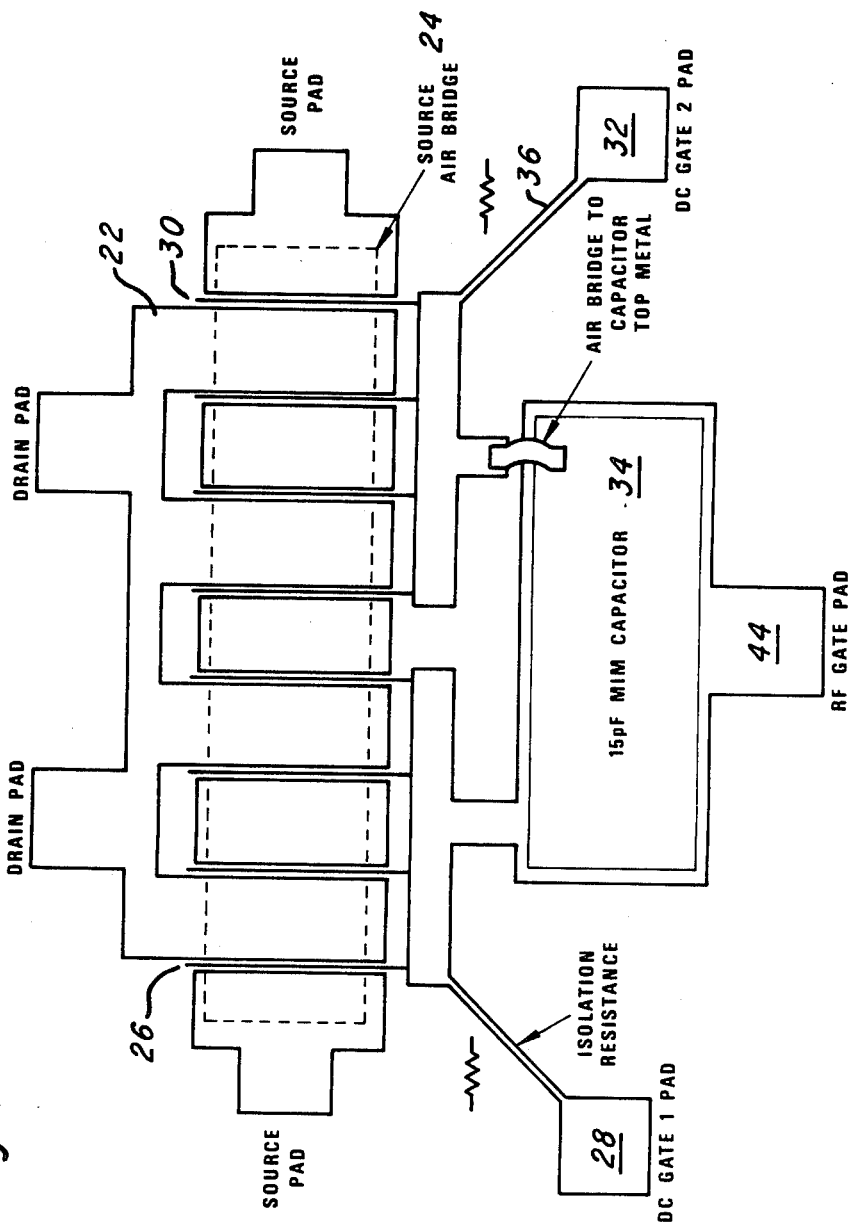

SWITCHED GEOMETRY OSCILLATOR

BACKGROUND OF THE INVENTION

The present invention relates to a multi-band microwave oscillator.

A general difficulty in adapting microwave techniques for consumer and commercial applications is the difficulty of fabricating cheap structures which are not confined to a relatively narrow bandwidth. For example, satellite down links and assigned satellite broadcast bands are widely spaced across the microwave spectrum, and it is difficult enough to design a receiver to cover much of any one band, without attempting to cover multiple bands. However, the ability to select among channels of reception is highly desirable, not only to permit user versatility, but also to allow for adaptation to changing weather conditions, which may affect the propagation characteristics of different frequency bands differently. Multi-band capability in a local oscillator permits multi-band reception in a conventional superheterodyne receiver, but there is at present no cheap way to achieve such multi-frequency capability in a single microwave local oscillator.

Frequency-agility is useful in frequency-hopping communications systems. Such systems have been proposed to obtain better spectrum utilization where many users each have a low individual use rate and independent access as with mobile radio networks. Frequency-hopping agility is also useful in many military applications, particularly electronic countermeasures.

It is thus an object of the present invention to provide a multi-band microwave oscillator.

It is a further object of the present invention to provide a multi-band microwave oscillator which can be very economically fabricated.

It is a further object of the present invention to provide a very cheap multi-band microwave communications receiver.

SUMMARY OF THE INVENTION

To achieve the above and other objects, the present invention provides an oscillator circuit incorporating transistors which are RF coupled but DC isolated. The gate of only one transistor is selectably biased into cut-off, converting the circuit from a two-active-element configuration into a one-active-element configuration. Alternatively, the circuit is configured so that, when both devices are active, the circuit operates in the push-push mode. By this means a nearly two-to-one ratio of oscillation frequencies is obtained. Alternatively, a switched-geometry network incorporates more than two active elements to permit selection of more than two frequencies.

In a superheterodyne receiver, the switched-geometry oscillator switches the local-oscillator frequency between two different bands, permitting multi-band microwave reception. Alternatively, plural switched-geometry oscillators are used by using additional switched-geometry oscillators to selectively alter the downconversion to the lower intermediate frequencies.

According to the present invention, there is provided:

An oscillator comprising:

A plurality of transistors, each said transistor comprising a gate, a source, and a drain, said respective sources of all of said transistors being electrically common, and said respective drains of all of said transistors being electrically common, and each of said respective gates being RF-coupled to and DC-isolated from the others of said respective gates; and means, connected to at least one of said gates, for biasing at least one but less than all of said transistors to pinch-off.

BRIEF DESCRIPTION OF THE DRAWINGS

The present invention is described with reference to the accompanying drawings, wherein:

FIGS. 2a and 2b show equivalent circuits of the oscillator of the present invention in one-active-device and two-active-device modes, respectively;

FIG. 3 shows RF voltage curves indicating operation in the push-push mode;

FIG. 4 indicates the relation of frequency vs. bias voltage which may be attained in one operating embodiment of the present invention;

FIG. 7 shows an integrated layout for the switched-geometry oscillator of the present invention;

DESCRIPTION OF THE PREFERRED EMBODIMENTS

Figure 1:
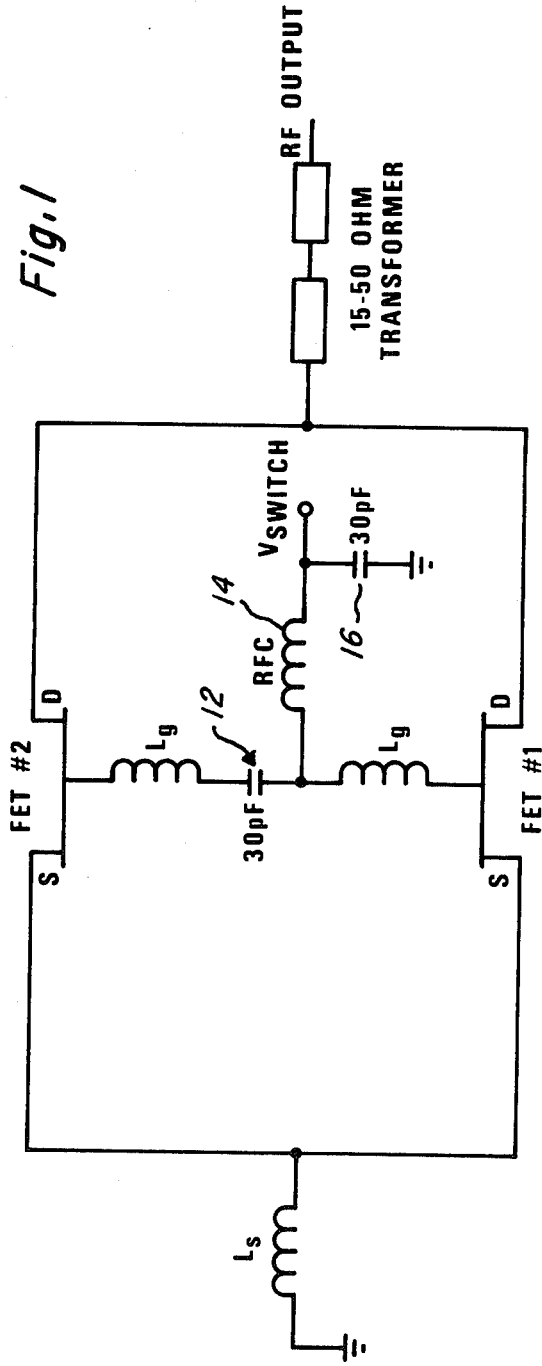
FIG. 1 generally shows an embodiment of the oscillator of the present invention.

FIG. 1 shows generally a first configuration of the switched-geometry oscillator of the present invention. Note that the gates of FET 1 and FET 2 are DC-isolated by capacitor 12, but this capacitor does not interfere with the RF connection at microwave frequencies. A bias circuit, connected through radio frequency choke 14 and grounding capacitor 16, provides the bias voltage from terminal $V_{switch}$ to FET 1 only. By providing a sufficiently large bias voltage at terminal $V_{switch}$, FET 1 may be kept pinched off through the complete RF cycle of the circuit. Thus, the effect of applying different bias voltages is to change the effective circuit configuration between the two states shown in FIGS. 2a and 2b.

FIG. 2a shows the effective configuration of the circuit where both devices are active. In the configuration as shown, this will normally result in push-push operation, as shown in FIG. 3, where each device oscillates at half of the circuit output frequency, but the asymmetrical output currents generated by each separate device combine to produce a doubled output frequency in which the subharmonic (i.e. the frequency of each active device) is well suppressed.

The RF voltage swing, which is of opposite polarity at each gate, forward biases one FET's gate-source diode while pinching off the 2nd FET, and then reverses the process as the RF swing reverses. As the gate of FET #1 is driven into forward diode conduction (clamping the gate-source voltage at 0.6 V), FET #2 is driven towards pinch-off. Since both gates are operated floating (no DC return), the RF swing centers on the zero voltage reference line. At zero volts on both FETs the total drain current is two times the IDSS current of a single FET. As one FET is driven towards pinch-off due to the RF voltage swing, the total drain current drops to IDSS of one device. This will effectively generate the second harmonic of the fundamental operating frequency of each FET as shown graphically in FIG. 3A in the drain current plot.

The same principle of out-of-phase gates is optionally used to selectably produce higher harmonics. However, the problem of maintaining oscillation becomes acute here. Moreover, if several devices are used, the output will include strong unwanted harmonics and subharmonics. For example, if three devices oscillating at the same frequency have relative phases of 0 degrees, +144 degrees, and +216 degrees, and their outputs are half-wave-rectified and summed, a significant output component occurs at 5F (in addition to 1F, 2F, and 3F). If the device at +216 degrees (or +144 degrees) is pinched-off, the 5F component becomes much weaker, and if any two devices are pinched-off, the higher components vanish. Thus the present invention is also useful in such a configuration. In this case, heavy high-pass output filters would be required. In the 5F mode, all devices are biased as near pinch-off as possible, creating a more asymmetrical waveform while sustaining oscillation, to increase the high-order harmonic power. In the lower-frequency modes, bias is farther from pinch-off to provide additional gain to compensate for the parasitic resistance of the pinched-off devices.

When one FET is pinched off, the equivalent circuit becomes as shown in FIG. 2b. In this configuration, pinching off FET 1 has ended the push-push operation. It has also changed the feedback characteristics seen by FET 2, so that the oscillation frequency of FET 2 has moved upband by about 25 percent.

These operating characteristics are graphically shown in FIG. 4. Note that the operating frequency of the circuit moves upband with increasing bias voltage until pinch off occurs, which in the embodiment to which FIG. 4 refers, is at about −2 volts. The actual circuit layout corresponding to the curve of FIG. 4 is given in FIG. 5.

Figure 5:
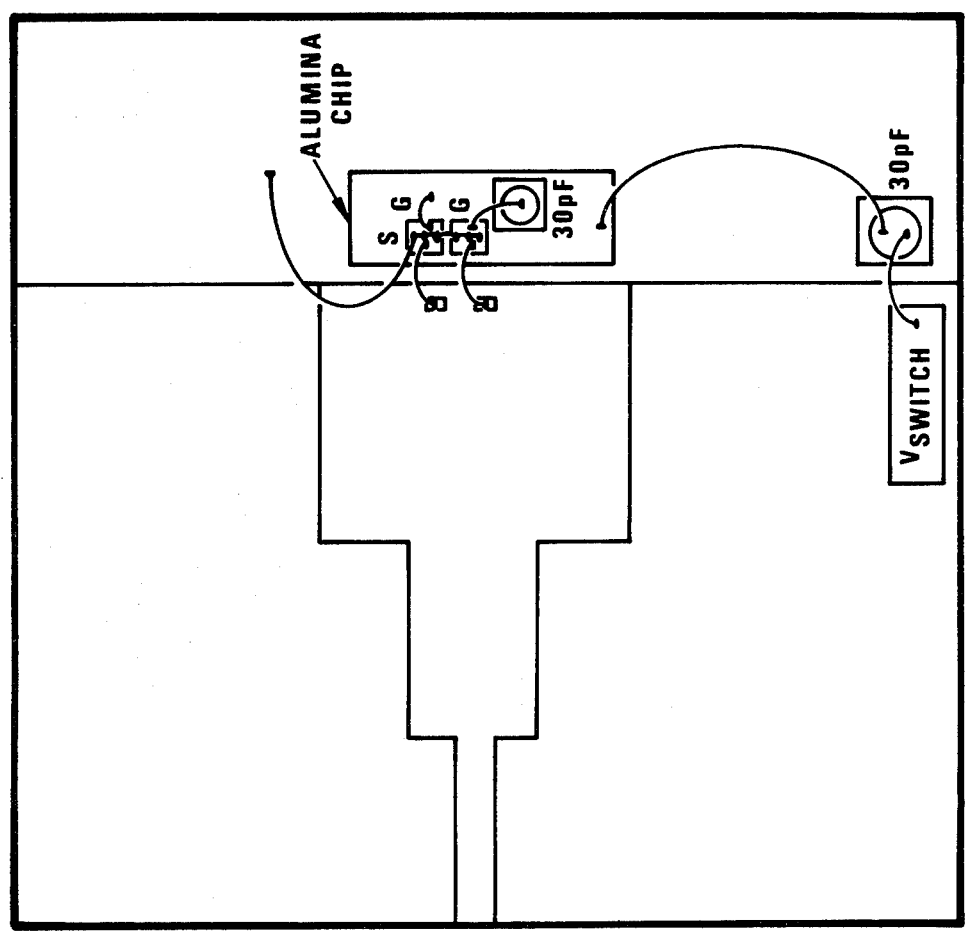
FIG. 5 shows the actual circuit layout corresponding to the curves of FIG. 4.

The sample embodiment of FIG. 5 uses a two-section 50 to 15 ohm impedance transformer centered at 19 GHz and realized on 10 mil alumina. The two 300 m FET's are alloyed to a 50 mil ×100 mil alumina circuit chip which was metallized on both sides. A 30 pF MIS capacitor was placed on the alumina chip beside the FETs as shown in FIG. 5, and used to RF couple the gates. The second FET gate DC bias was taken out using a bond wire to a 30 pF capacitor as an RF choke. An external bias tee was used to handle the drain bias.

It is not necessary to use push-push operation in connection with the switched-geometry principle described above. That is, a principle part of the invention is provided simply by pinching off a transistor to change the geometry of the circuit. Rather than use this effect to switch between push-push and fundamental modes, the effect may also be used to switch between fundamental modes at different frequencies.

Figure 6A:
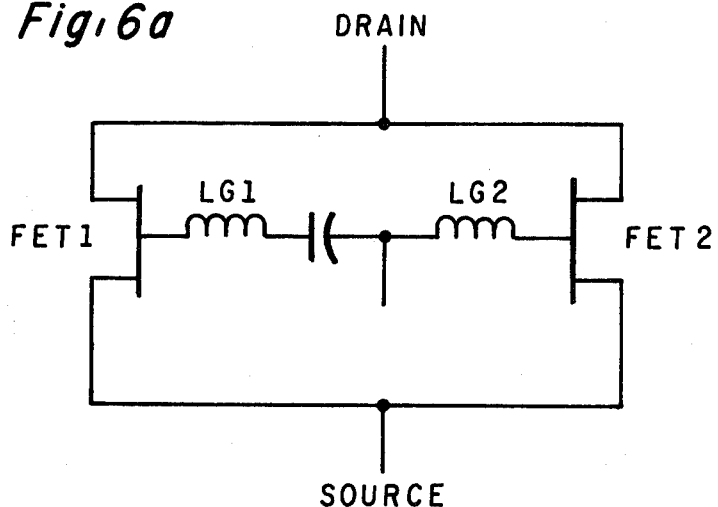
FIG. 6a and 6b show the respective gate circuit designs for obtaining push-push or fundamental operation in the two-active-device mode.
Figure 6B:
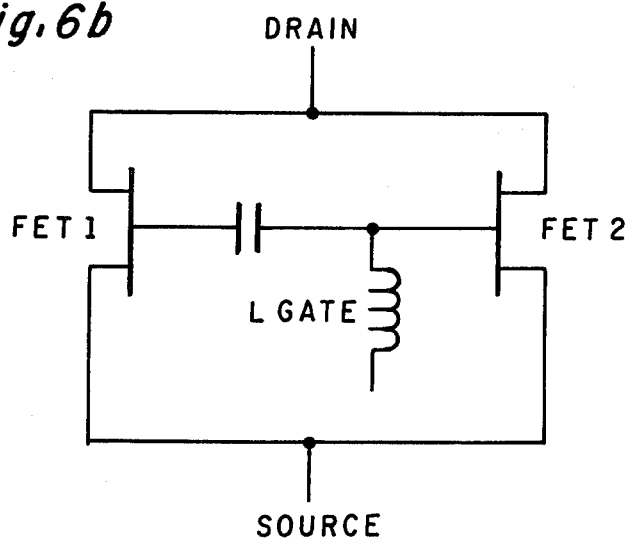

The elements in the circuit design which determine whether the circuit will operate between push-push and fundamental modes, rather than between fundamental and fundamental times N (where N is greater than unity and is determined by the change in effective active capacitance plus the parasitic elements of the second pinched-off FET) are the placement of the inductance in the gate circuit. (The DC blocking capacitor is transparent to RF, and inductive gate reactance is required to have oscillations in either the push-push or fundamental mode.) In the push-push mode circuit, as shown in FIG. 6a, the gate leads of FET 1 and FET 2 are separated by an inductive reactance (the capacitor is transparent to RF). This inductive reactance causes the phase difference between the gates which is necessary for push-push operation. In FIG. 6b all three terminals of either FET are tied directly together, so that the two FETs act effectively as one FET of active area equal to the sum of the areas of FET 1 and FET 2, since their gates are necessarily in phase, push-push operation is impossible. This configuration gives a switched-geometry oscillator switching between two different fundamental modes at different frequencies.

FIG. 7 shows a sample integrable embodiment of the oscillator of the present invention. Note that metallization 22 is used for the drain of both FET 1 and FET 2. Similarly, a source air bridge 24 is used to join the source areas of both FET 1 and of FET 2. The gate 26 of FET 1 is connected to a gate pad 28, and the gate 30 of FET 2 is connected to a gate pad 32. A MIM capacitor 34 is used to provide DC isolation between the gates. Note that the relatively long and thin metal connector 36 provides additional resistance and inductance to isolate the DC gate pads 28 and 32 from the gates 26 and 30 respectively. In this sample embodiment, the channel regions can be 75 microns wide, for a total gate length of 300 microns for each transistor.

Figure 8:
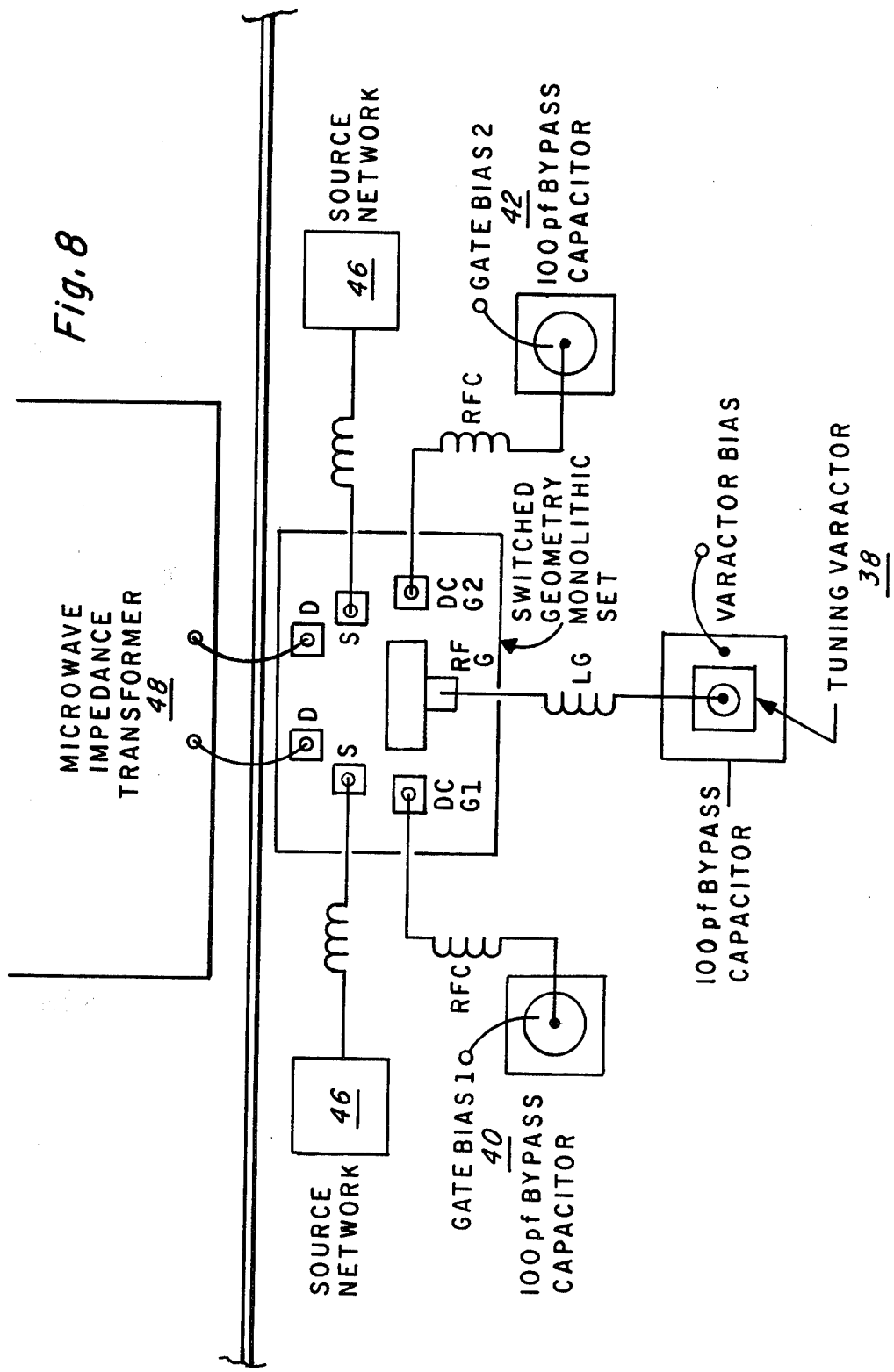
FIG. 8 shows an embodiment of the external connections of the switched-geometry oscillator.

FIG. 8 shows an example of how this switched-geometry oscillator might be combined with a tuning varactor 38, to provide an oscillator which could be both switched between different bands and tuned within each band. The tuning varactor 38 is connected to the RF gate pad 44. The use of separate gate bias connections 40 and 42, respectively indirectly connected to gate pads 28 and 32, permits optimization of frequency of operation, output power, and stable operating point of the FET. greater frequency agility is also obtained without the self-biasing gate. Conventional source networks 46, and a microwave impedance transformer 48 at the output, are also provided according to techniques well known in the art.

Figure 9:
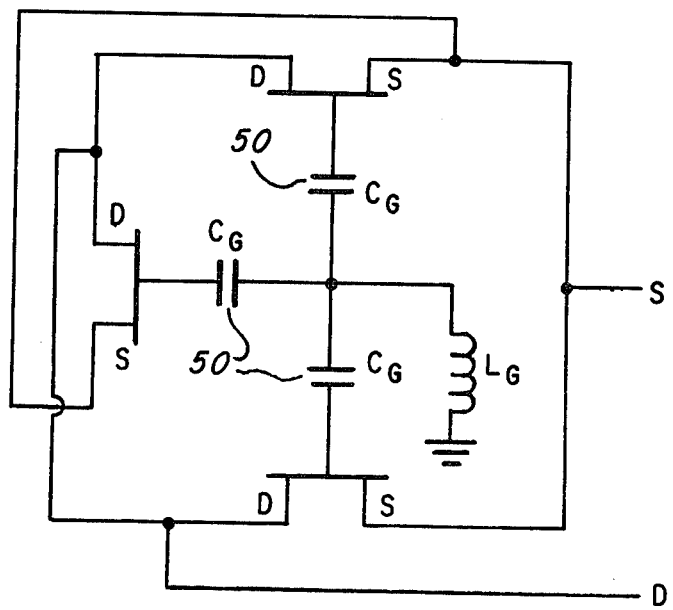
FIG. 9 shows a switched-geometry oscillator with multiple devices which switches between fundamental modes.

FIG. 9 shows an example of an embodiment which switches between fundamental-mode operation at two separate frequencies, and also an embodiment which uses more than two active devices.

Figure 10:
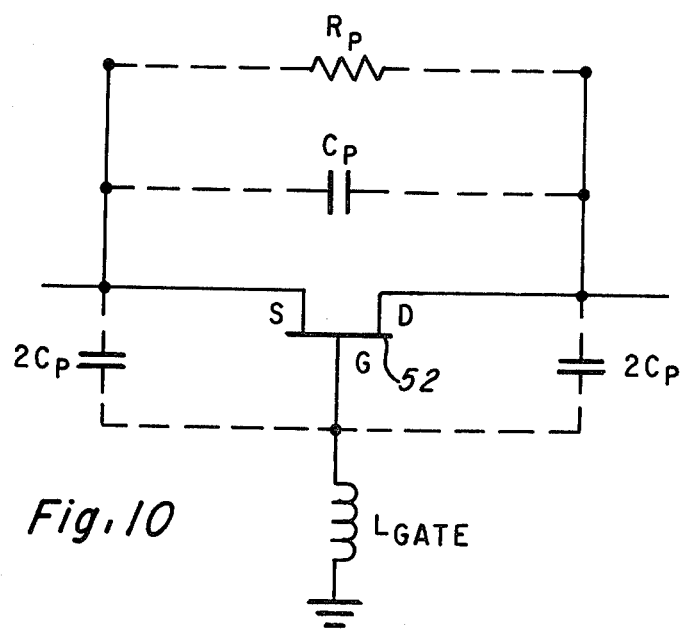
FIG. 10 shows an equivalent circuit of the multiple device oscillator of FIG. 9 when one device has been pinched-off.

The limit on the number of devices which can be used in a switched-geometry oscillator according to the present invention is in practice defined by how large the parasitic capacitance and resistance of the pinched-off devices is with respect to the gain and phase of the remaining active devices. In a plural-FET configuration as shown in FIG. 9, the gate-blocking capacitors 50 are preferably built monolithically, so that the inductive regenerative feedback (shown as element $L_g$ in FIG. 9) is common to the three gates at a well defined point, instead of having different phases at the three devices. If two devices are on and the third pinched off, then an equivalent circuit is as shown in FIG. 10. Since the remaining active FETs are now operating in phase, they are shown as one combined equivalent element 52 in FIG. 10. Since the parasitic capacitances $C_p$ of the pinched off FET have small values, and the drain-source resistance $R_p$ of the pinched off FET is approximately five to ten times higher than the series resistance of an active FET, a relatively small amount of feedback is generated. The crucial limitation here is that a sufficient feedback path will reduce the gain of the equivalent active element 52 below that which will sustain oscillations. Note that increasing the bias voltage to the pinched-off FETs beyond that necessary to cause pinch off will reduce the parasitic capacitance $C_p$ and increase the parasitic resistance $R_p$, permitting a larger number of FETs in a multi-FET oscillator to be pinched off.

Thus, the pinched-off FET provides both parasitic capacitance and parasitic resistance. The parasitic reactance provides a fine tuning of the desired oscillatory frequency of the remaining active device. Biasing beyond pinch-off will greatly reduce the parasitic resistance, but excessive biasing also reduces the parasitic capacitance. Thus, in a switched-geometry oscillator, excessive bias beyond the point where pinch-off occurs can be used to fine tune the desired frequency shift, and at least some bias beyond pinch-off is desirable to control parasitic resistance.

The embodiment of FIG. 1 has been shown with self-biasing gates, as disclosed and claimed in U.S. patent application No. 292,769, filed Aug. 14, 1981, which is hereby incorporated by reference. The use of the floating gate for the device that will always remain active could simplify the layout and reduce parasitic elements in multiple FET designs, since it would not require the extra pads and RF choke to get the DC bias into the device.

In addition, the gate lengths of the devices used need not be equal. Thus, in a two-device fundamental-mode switched-geometry oscillator, three oscillating frequencies are selectively attained where the two devices have different gate lengths, according to whether the shorter, the longer, or neither is pinched off. (Of course, each transistor must have a separate gate bias circuit since any one transistor may be pinched-off.) Similarly, the number of available frequencies in a multiple-device circuit may be increased by using dissimilar devices.

In a fundamental-to-fundamental multi-device circuit, the set of active gate lengths which can be used is limited by the ratio of voltage gain per unit gate length of active device to voltage loss (into parasitic resistance) per unit gate length of pinched-off device. In current MESFET technology, a gain/loss ratio of around 10:1 is easily attainable. Thus, a three-device circuit having gate lengths in the ratio of 1:2:4 permits any one active device to sustain oscillation, and numerous distinct oscillatory frequencies can be selected.

In a superheterodyne communications receiver, more than one switched-geometry oscillator may be used to further increase the number of available frequencies. For example, if the downconversion from the first intermediate frequency to the next lower intermediate frequency is accomplished by means of a switched-geometry oscillator, more than one first intermediate frequency may selectively be used. Thus, for example, where a switched geometry oscillator provided at the local oscillator stage can switch between 10 GHz and 15 GHz, and a switched-geometry oscillator is provided to down convert from the first intermediate frequency which can switch between 1 GHz and 1.5 GHz, and the second intermediate frequency is 100 Megahertz, then reception would be available in tuned frequency bands near 11.1 GHz, 11.6 GHz, 16.1 GHz, or 16.6 GHz.

To stabilize the multi-frequencies of operation available with the present invention in a communications receiver, dielectric resonators may be used. Since the modes of a dielectric resonator are typically not harmonically related, and since dielectric resonators typically have a controllable sensitivity to temperature change and can tolerate mechanical vibration easily, dielectric resonators permit reliable stablization of local oscillator frequency. For example, a dielectric pack (having epislon=35) which is cylindrical and measures 10 mm wide and 5 mm tall typically resonates at 15 GHz and 17 GHz. Thus, a dielectric resonator structure can be used (in a reflective, transmissive, or reactive configuration) with the switched-geometry oscillator to obtain stabilized oscillations at each frequency. Dielectric resonator structures are well known to have multiple modes at widely spaced frequencies which differ in insertion loss by only a few decibels. These parameters (insertion loss, fundamental and other mode frequencies) are affected by the dielectric constant, width to height ratio, and shape of the structure (circle, rectangle, etc.) and therefore are selectable to match those required for stabilization of a switched-geometry oscillator. Further background on dielectric resonators is found in IEEE Trans. Microwave Theory Tech., Vol. MTT-29, pp. 754–770, August 1981, and literature cited therein, all of which is hereby incorporated by reference. Alternatively, more than 1 dielectric resonator can be used if the circuit is configured so that each resonator is alternatively stabilizing the oscillator at one frequency but becomes transparent at all other frequencies.

It will be obvious to those skilled in the art that a broad range of equivalents may be used in practicing the present invention, which is not limited except as specified in the accompanying claims.

While the present invention is optionally embodied in silicon, or in MOSFET technology, GaAs MESFET permits an easy solution to the unique problems of microwave systems as discussed above.

Preferably the invention is realized using N-channel MESFET devices having about 5 microns channel length (ca. ½ micron gate length), formed in an epitaxial or implanted device layer on a semi-insulating GaAs substrate. (As discussed above, the gate width is typically hundreds of microns.) The switched-geometry oscillator is preferably integrated with one or more monolithic varactors as disclosed in U.S. patent application Ser. Nos. 292,770 and 293,040, both filed Aug. 14, 1981, which are both hereby incorporated by reference, to provide fine-tuning.

What I claim is:

1. An oscillator comprising:
   a plurality of transistors, each said transistor comprising a gate, a source, and a drain, said respective sources of all of said transistors being electrically common, and said respective drains of all of said transistors being electrically common, and at least one of said respective gates being RF-coupled to and DC-isolated from the others of said respective gates;
   means, connected to at least one of said gates, for selectably biasing at least one but less than all of said transistors to pinch-off; and
   frequency determining electrical reactance means connected to at least one of said gates.

2. The oscillator of claim 1, wherein an inductive reactance means is interposed between said respective gates, whereby voltages on said gates are out of phase when said selective pinch-off means has not pinched-off said gates.

3. The oscillator of claim 2 comprising only two of said transistors, the respective voltages on said respective gates being 180 degrees out of phase when both said transistors are not pinched-off.

4. The oscillator of claim 1 wherein a respective large capacitance means is interposed between respective ones of said gates, whereby said gates are DC-isolated.

5. The oscillator of claim 4,
wherein each said respective gate is directly connected to said respective capacitance means, and further comprising:
an inductive reactance means interposed between said gates and ground.

6. The oscillator of claim 5,
wherein at least one of said transistors comprises a gate length which is unequal to the gate length of others of said transistors.

7. The oscillator of claim 5,
wherein said oscillator comprises three of said transistors.

8. The oscillator of claim 7,
wherein said three transistors comprise respective gate lengths in the approximate ratio of 1:2:6.

9. The oscillator of claim 1, 2, 3, 4, 5, 6, 7, or 8, wherein each said transistor is a MESFET.

10. The oscillator of claim 9, wherein each said transistor comprises a GaAs channel region.

* * * * *